(12) United States Patent
Chiang et al.

(10) Patent No.: US 10,177,018 B2
(45) Date of Patent: Jan. 8, 2019

(54) PROCESS KIT EROSION AND SERVICE LIFE PREDICTION

(71) Applicant: Applied Materials, Inc., Santa Clara, CA (US)

(72) Inventors: Kang-Lie Chiang, San Jose, CA (US); Greg A. Blackburn, Santa Clara, CA (US); Pallavi Zhang, San Jose, CA (US); Michael D. Armacost, San Jose, CA (US); Nitin Khurana, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/674,180

(22) Filed: Aug. 10, 2017

(65) Prior Publication Data

US 2018/0047599 A1    Feb. 15, 2018

Related U.S. Application Data

(60) Provisional application No. 62/373,643, filed on Aug. 11, 2016.

(51) Int. Cl.
| | | |
|---|---|---|
| *H01L 21/67* | (2006.01) | |
| *G01R 21/06* | (2006.01) | |
| *G01R 19/165* | (2006.01) | |

(52) U.S. Cl.
CPC .. *H01L 21/67253* (2013.01); *G01R 19/16576* (2013.01); *G01R 21/06* (2013.01); *H01L 21/67069* (2013.01); *H01L 21/67242* (2013.01); *H01L 21/67276* (2013.01)

(58) Field of Classification Search
CPC ......... H01L 21/67253; H01L 21/67242; H01L 21/67276; H01L 21/67069; G01R 19/16576; G01R 21/06
See application file for complete search history.

(56) References Cited

U.S. PATENT DOCUMENTS

| | | | |
|---|---|---|---|
| 2015/0221484 A1* | 8/2015 | Iliopoulos | H01J 37/32935 118/697 |
| 2016/0216185 A1 | 7/2016 | Gottscho | |

OTHER PUBLICATIONS

U.S. Appl. No. 15/679,040, filed Aug. 16, 2017.

* cited by examiner

*Primary Examiner* — Fei Fei Yeung Lopez
(74) *Attorney, Agent, or Firm* — Patterson + Sheridan, LLP

(57) ABSTRACT

Embodiments of the present disclosure provide a method, system, and computer program product for monitoring a service life of a chamber component. In one example, the method includes receiving one or more power measurements of a semiconductor processing chamber from one or more sensors positioned about the semiconductor processing chamber. The processor compares the one or more power measurements to one or more threshold values corresponding to the service life of the chamber component. The processor determines whether the one or more power measurements exceed the threshold values. If the processor determines that the one or more power measurements exceed the threshold values, the processor takes remedial measures for the service life of the chamber component.

17 Claims, 7 Drawing Sheets

PROCESS KIT EROSION AND SERVICE LIFE PREDICTION

CROSS-REFERENCE TO RELATED APPLICATIONS

This application claims priority from U.S. Application Ser. No. 62/373,643, filed Aug. 11, 2016, which is hereby incorporated by reference in its entirety.

BACKGROUND

Field

Embodiments described herein generally relate to a processing chamber, and more specifically, to a method, system, and computer program product for monitoring a service life of a chamber component.

Description of the Related Art

In semiconductor processing chambers, substrates undergo various processes such as deposition, etching and annealing. During some of the processes, the substrate is placed onto a substrate support such as an electrostatic chuck (ESC), for processing. In an etch process a ring may be placed around the substrate to prevent erosion of the areas of the substrate support that are not covered by the substrate. The ring focuses the plasma and positions the substrate in place.

Rings are usually made of quartz or silicon based material and are highly consumed in the etch process as they are exposed to etching gases and/or fluids. The rings are etched by the plasma during wafer processing and eventually begin to erode. The erosion of the rings leads to process drift after sufficient material removed from the ring changes the profile of the processing plasma along the edge of substrate. The process drift ultimately leads to defects on the substrates. The rings that are significantly eroded are usually replaced to ensure process conformity and prevent the manufacturing defects from affecting processing yields. However, replacing the rings requires the manufacturing process equipment to be shutdown, which is expensive. There is a tradeoff of between shutting down the manufacturing process to replace the rings prior to generating defects and significantly reducing the service life of the ring and lowering manufacturing yields.

Therefore, an improved method and apparatus are needed for monitoring a service life of a chamber component.

SUMMARY

Embodiments of the present disclosure provide a method, system, and computer program product for monitoring a service life of a chamber component. In one example, the method includes receiving one or more power measurements of a semiconductor processing chamber from one or more sensors positioned about the semiconductor processing chamber. The processor compares the one or more power measurements to one or more threshold values corresponding to the service life of the chamber component. The processor determines whether the one or more power measurements exceed the threshold values. If the processor determines that the one or more power measurements exceed the threshold values, the processor issues a notice of a state of the chamber component.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
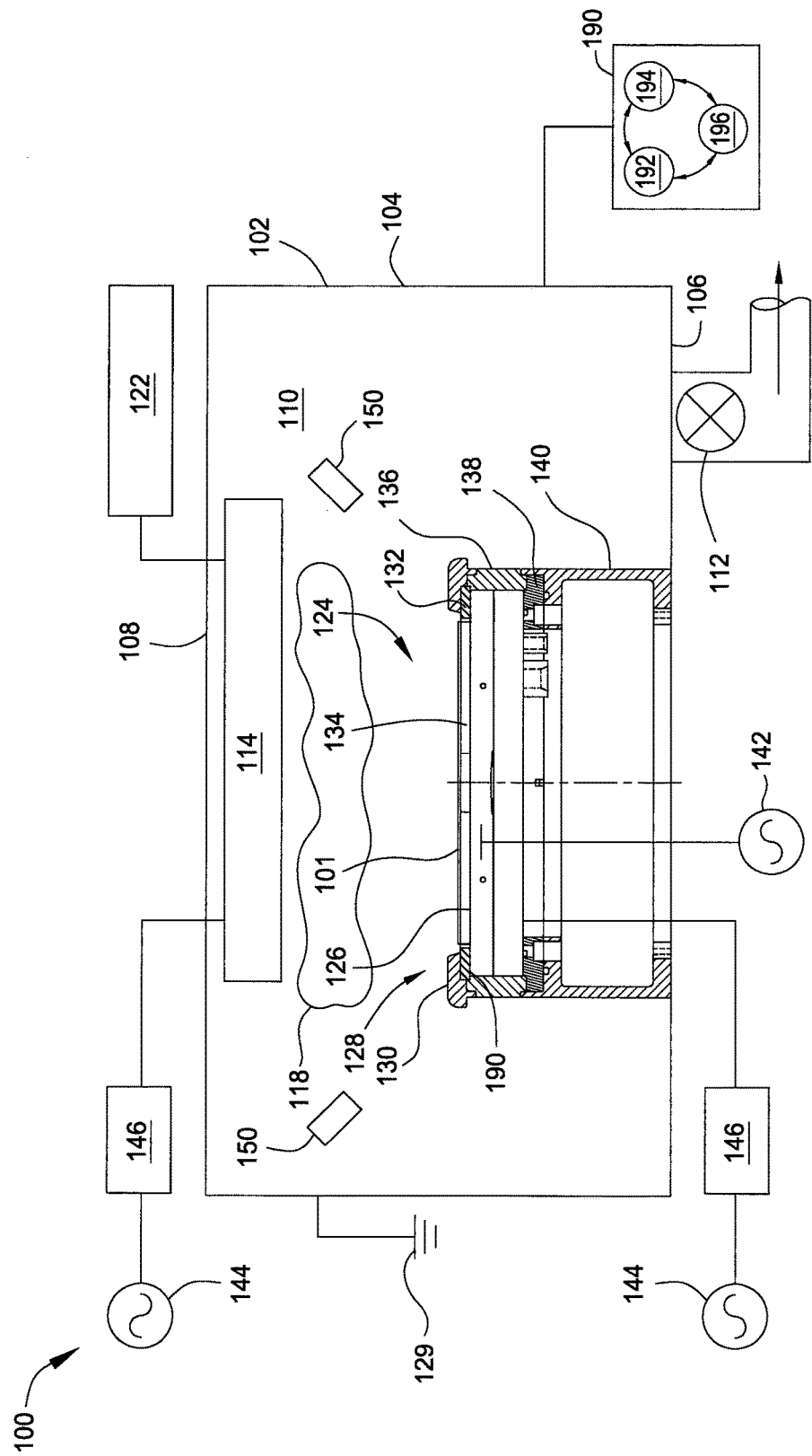
FIG. 1 is a schematic cross-sectional view of a processing chamber in communication with a computing system, according to one embodiment.

For clarity, identical reference numerals have been used, where applicable, to designate identical elements that are common between figures. Additionally, elements of one embodiment may be advantageously adapted for utilization in other embodiments described herein. Directional language such as "above," "below," "adjacent," and the like do not refer to an absolute direction, but are relative to a basis of an apparatus being described, which is apparent from the orientation shown in the figures.

DETAILED DESCRIPTION

FIG. 1 is a schematic cross sectional view of a processing chamber 100 in communication with a computing system 200 configured to run a service life monitoring code, according to one embodiment. As shown, the processing chamber 100 is a plasma etching chamber configured to etch a substrate. Examples of processing chambers that may be adapted to benefit from the disclosure are SYM3™ and Mesa™ processing chambers, commercially available form Applied Materials, Inc., located in Santa Clara, Calif. It is contemplated that other processing chambers including those from other manufacturers may be adapted to benefit from the disclosure.

The processing chamber 100 may be used for various plasma processes. In one embodiment, the processing chamber 100 may be used to perform dry etching with one or more etching agents. For example, the processing chamber may be used for ignition of plasma from a precursor $C_xF_y$, (where x and y can be different allowed combinations, $O_2$, $NF_3$, or combinations thereof). Embodiments of the present disclosure may also be used in etching chromium for photomask application, etching a profile, such as deep trench and through silicon vias (TSV), in a silicon substrate having oxide and metal layers disposed on the substrate 101.

The processing chamber 100 includes a chamber body 102 having sidewalls 104, a bottom 106, and a chamber lid 108. The sidewalls 104, bottom 106, and chamber lid 108 define an interior volume 110. The interior volume 110 is a high vacuum vessel that is coupled through a throttle valve (not shown) to a vacuum pump 112. The processing chamber 100 may further include a showerhead 114 disposed proximate the lid 108. The showerhead 114 is in communication with a gas panel 122. The gas panel 122 is configured to provide one or more gases to the showerhead 120. The showerhead 120 is configured to introduce the one or more gases into the interior volume 110. The showerhead 120 may also be coupled to an RF power source 144 to the showerhead 120. The plasma may be used to etch a feature in the substrate 101 during processing, and then pumped out of the processing chamber 100 through the vacuum pump 112.

The processing chamber 100 further includes a substrate support 124. The substrate support 124 is disposed in the interior volume 110, beneath the showerhead 120. In one embodiment, the substrate support 124 generally includes an electrostatic chuck (ESC) 126, a ring assembly 128 having a cover ring 130 and an edge ring 132, a cathode 134, an insulator pipe 136, a pedestal insulator 138, and a pedestal support 140. The cathode 134 is configured to electrically bias the ESC 126. The insulator pipe 136 and pedestal insulator 138 are configured to electrically isolate the chamber walls and the substrate support 124, respectively, from the electrical bias applied to the ESC 126. The substrate support 124 may be biased by a DC power supply 142. An RF power source 144 may optionally be coupled to the substrate support 124 through a matching network 146.

The cover ring 130 may be a single piece ring that rests on the edge ring 132 and insulator pipe 136. The ESC 126 is configured to support the substrate 101. The cover ring 130 and the edge ring 132 are configured to surround the substrate 101 when supported by the ESC 126. In plasma etch chambers, the cover ring 130 and edge ring 132 are configured to protect the ESC 126 from exposure to plasma as well as control the plasma near the substrate 101 during processing. During processing, the plasma has the tendency to erode the cover ring 130 and the edge ring 132. Erosion of the cover ring 130 and the edge ring 132 decreases the service life each component part, and also may result in particle contamination of the substrate 101 being processed.

In one embodiment, the cover ring 130 has a height, H, that extends above the cover ring 130. When the cover ring 130 erodes during processing, the height H shrinks in size. Additionally, in one embodiment, the edge ring 132 may have a pocket 152 formed therein. The pocket 152 has a width W and depth D. When the edge ring 132 erodes the width W of the pocket 152 begins to widen, and the depth D begins to increase.

The processing chamber 100 further includes one or more sensors 150. The one or more sensors 150 may be positioned proximate the cover ring 130 and the edge ring 132. In one embodiment, the one or more sensors 150 are positioned in the interior volume 110. The one or more sensors 150 are configured to detect changes in power corresponding to either the DC bias measurement or an RF source power measurement over time. The one or more sensors 150 are in communication with a controller 190.

The controller 190 includes programmable central processing unit (CPU) 192 that is operable with a memory 194 and a mass storage device, an input control unit, and a display unit (not shown), such as power supplies, clocks, cache, input/output (I/O) circuits, and the liner, coupled to the various components of the processing system to facilitate control of the substrate processing.

To facilitate control of the chamber 100 described above, the CPU 192 may be one of any form of general purpose computer processor that can be used in an industrial setting, such as a programmable logic controller (PLC), for controlling various chambers and sub-processors. The memory 194 is coupled to the CPU 192 and the memory 194 is non-transitory and may be one or more of readily available memory such as random access memory (RAM), read only memory (ROM), floppy disk drive, hard disk, or any other form of digital storage, local or remote. Support circuits 196 are coupled to the CPU 192 for supporting the processor in a conventional manner. Charged species generation, heating, and other processes are generally stored in the memory 194, typically as software routine. The software routine may also be stored and/or executed by a second CPU (not shown) that is remotely located from the processing chamber 100 being controlled by the CPU 192.

The memory 194 is in the form of computer-readable storage media that contains instructions, that when executed by the CPU 192, facilitates the operation of the chamber 100. The instructions in the memory 194 are in the form of a program product such as a program that implements the method of the present disclosure. The program code may conform to any one of a number of different programming languages. In one example, the disclosure may be implemented as a program product stored on a computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips, or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

Figure 2:
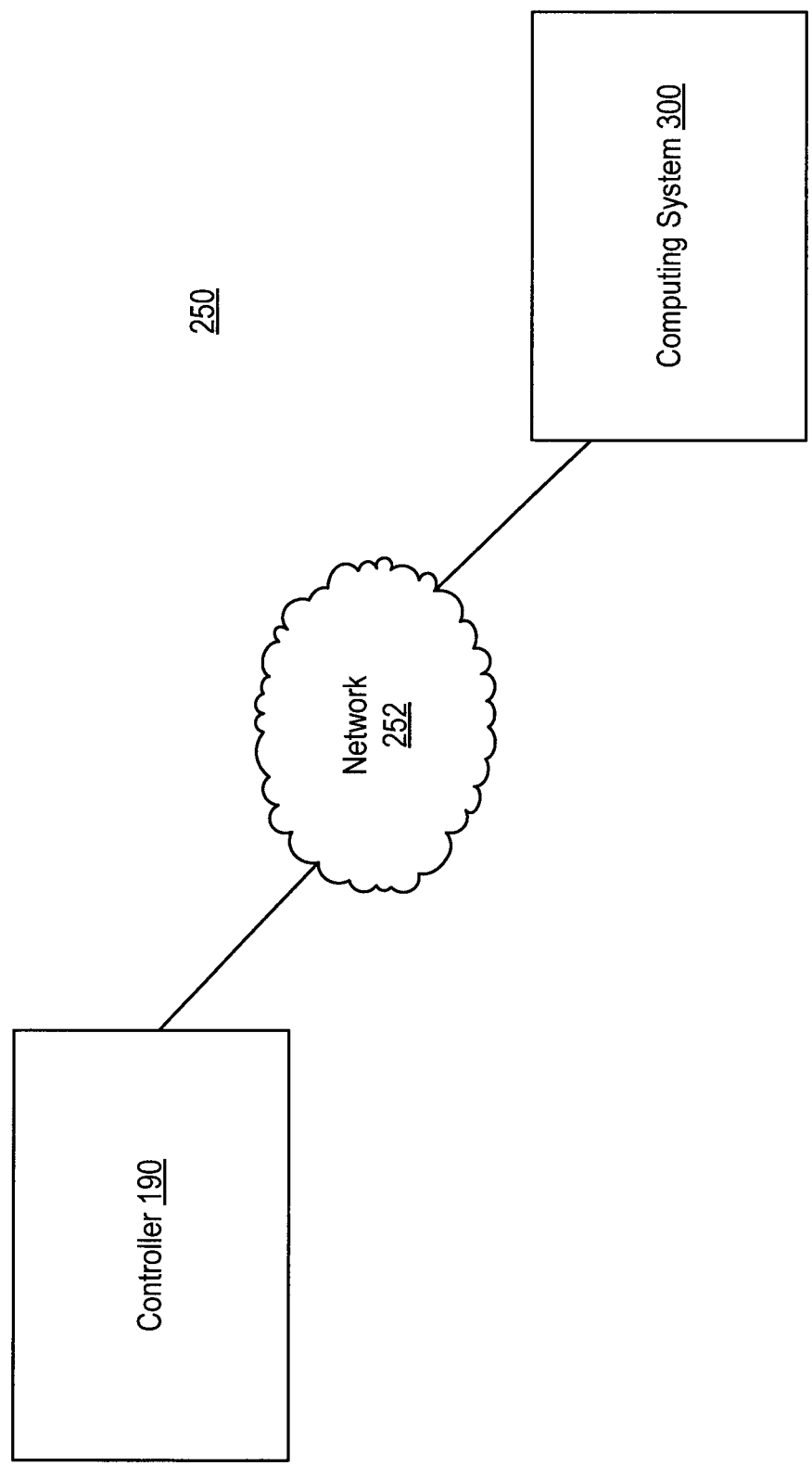
FIG. 2 illustrates a computing environment, according to one embodiment.

FIG. 2 illustrates a computing environment 250, according to one embodiment. The computing environment 250 includes the controller 190, a computing system 200, and a network 252. The computing system 200 communicates with the controller 190 via the network 252. The computing system 200 is configured to determine when to shut down the chamber 100, and replace the cover ring 130 and edge ring 132. The computing system 200 communicates with the controller 190 to adjust process parameters, or stop the processing altogether, based on the power measurement.

Figure 3:
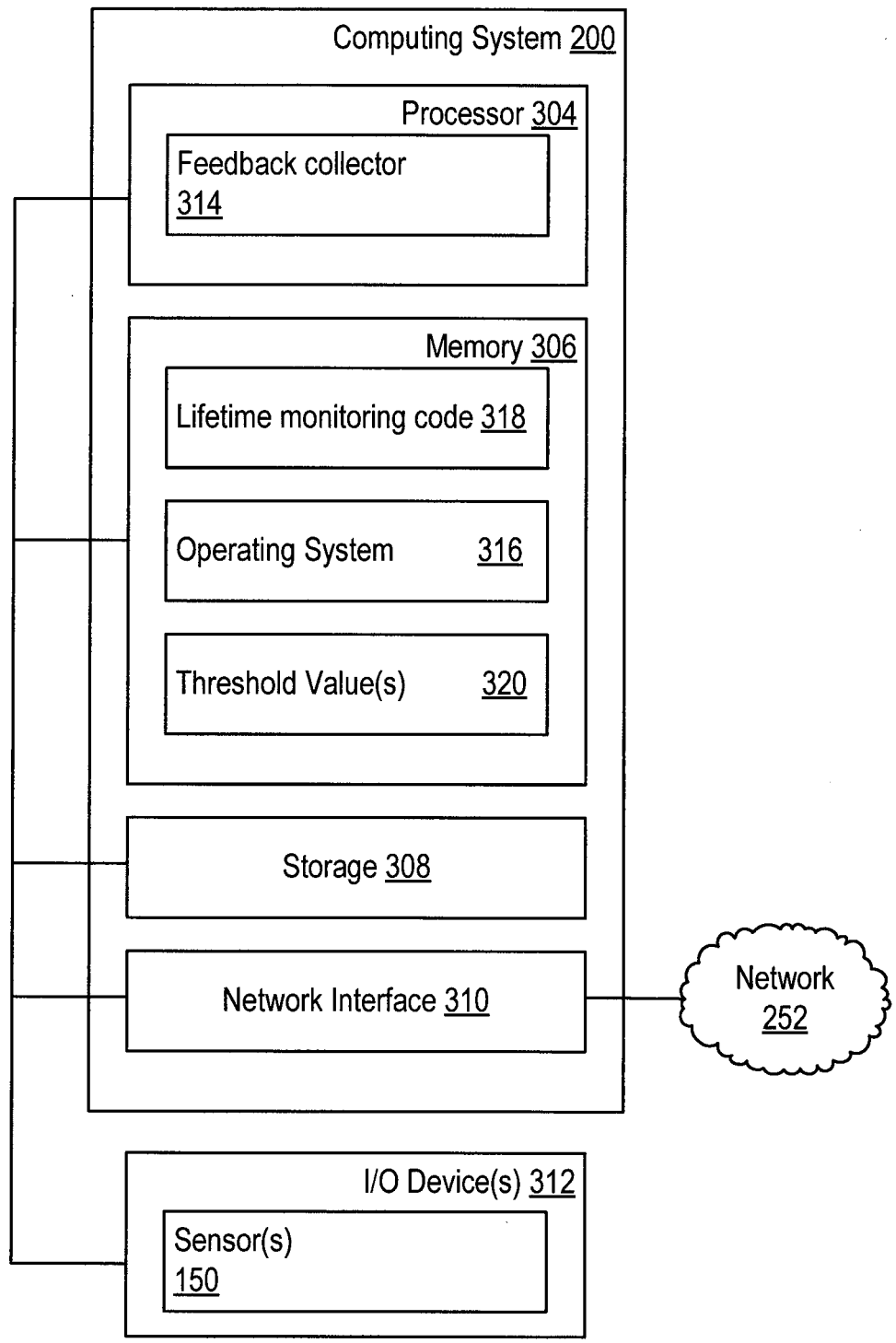
FIG. 3 illustrates a computing system, according to one embodiment.

FIG. 3 illustrates the computing system 200, according to one embodiment. The computing system 200 includes a processor 304, a memory 306, storage 308, and a network interface 310. The processor 304 retrieves and executes programming instructions, such as service life monitoring code 318, stored in memory 306. The processor 304 is included to be representative of a single processor, multiple processors, a single processor having multiple processing cores, and the like. The storage 308 may be a disk drive storage device. Although shown as a single unit, the storage 308 may be a combination of fixed and/or removable storage devices, such as fixed disk drives, removable memory cards, optical storage, network attached storage (NAS), or storage-area-network (SAN). The network interface 310 may be any type of network communications allowing the computing system 200 to communicate with other computers via the network 252.

The computing system 200 also includes I/O devices 312 connected to the computing system 200. The I/O devices 312 include the one or more sensors 150. The one or more sensors 150 are configured to detect changes in power corresponding to either the DC bias measurement or an RF source power measurement over time. The processor 304 receives the power measurement from the one or more sensors 150. The processor 304 includes a feedback collector 314. The feedback collector 314 is configured to collect the power measurement from the I/O devices 312. The feedback collector 314 provides the power measurements to memory 306.

The memory 306 includes an operating system 316, service life monitoring code 318, and threshold value(s) 320. The operating system 316 may be any operating system capable of performing the functions described herein. The service life monitoring code 318 is configured to compare the received power measurements to one or more threshold values. The threshold value(s) 320 include the one or more threshold values for determining the service life of the chamber components. Such chamber components may include cover rings (such as cover ring 130), edge rings (such as edge ring 132), and other parts of a processing chamber that are subject to wear over time. The service life monitoring code 318 compares the received power measurements to the threshold value to monitor the current state of the chamber components. If the service life monitoring code 318 determines that the received power measurement exceeds one of the threshold values 320, the computing system 200 may communicate with the controller 190 of the processing chamber 100 to send a notice regarding the service life of the chamber component, stop processing, or change the processing parameters.

Figure 4:
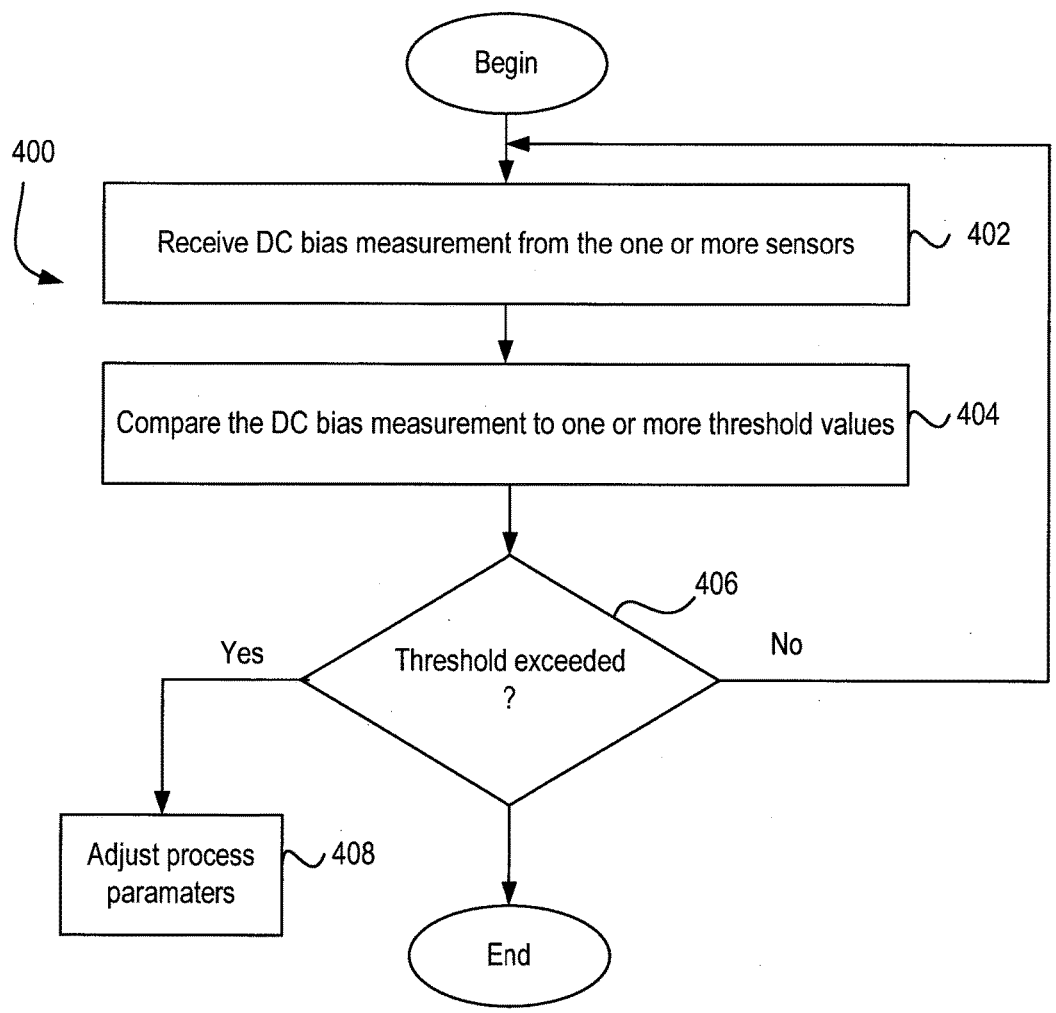
FIG. 4 is a flow diagram illustrating a method of monitoring a service life of a chamber component, according to one embodiment.

FIG. 4 is a flow diagram illustrating a method 400 for monitoring a service life of chamber components, according to one embodiment. As shown, the method 400 begins at block 402.

At block 402, the feedback collector 314 receives power measurements from one or more sensors 150. In one embodiment, the one or more sensors 150 are configured to measure a current of the DC bias power. In another embodiment, the one or more sensors are configured to measure a voltage of the DC bias power. In yet another embodiment, the one or more sensors 150 are configured to measure a DC bias match position.

At block 404, the processor 304 compares the DC bias measurement to one or more threshold values. The one or more threshold values represent DC bias measurements that correspond to an amount of erosion of the cover ring 130 and the edge ring 132. Generally, a downward trend in DC bias measurements is indicative of the height H of the cover ring 130 eroding. For example, initially the one or more sensors measure a DC bias voltage of 1230 V for a 0.25 inch cover ring. As the cover ring begins to erode, over approximately 1500 wafers processed or 200 RF hours, the DC bias voltage hovers between 1245 V and 1225 V. After the cover ring erodes about 0.09 inches to about 0.15 inches, the one or more sensor detect a DC bias voltage of about 1211 V, about a 1.5% drop. As the cover ring erodes further, 0.09 inches to 0.00 inches, the one or more sensors 150 detect a DC bias voltage of about 1144 V, about a 5.5% drop from 1211 V.

At block 406, the processor 304 determines whether the DC bias measurement exceeds the one or more threshold values. The one or more threshold values may correspond to one or more values that indicate a state of a processing chamber component. For example, one of the threshold values may be 1144 V. If the processor 304 determines that the DC bias measurements exceeds one of the threshold values, then at block 408 the processor 304 communicates with the controller 190 to issue a notice of the state of the cover ring. For example, the controller 190 may issue an alarm, such as a light or source, or issue an electronic notice, such as an email, text message, or other electronic signal to another electronic device, to notify a technician, operator, or other person/entity of the condition of the cover ring. Alternatively, the processor 304 may communicate with the controller 190 to stop processing, so that the cover ring or edge ring may be replaced. If the processor 304 determines that the DC bias measurement does not exceed one of the threshold values, then the method 400 reverts to block 402.

Figure 5:
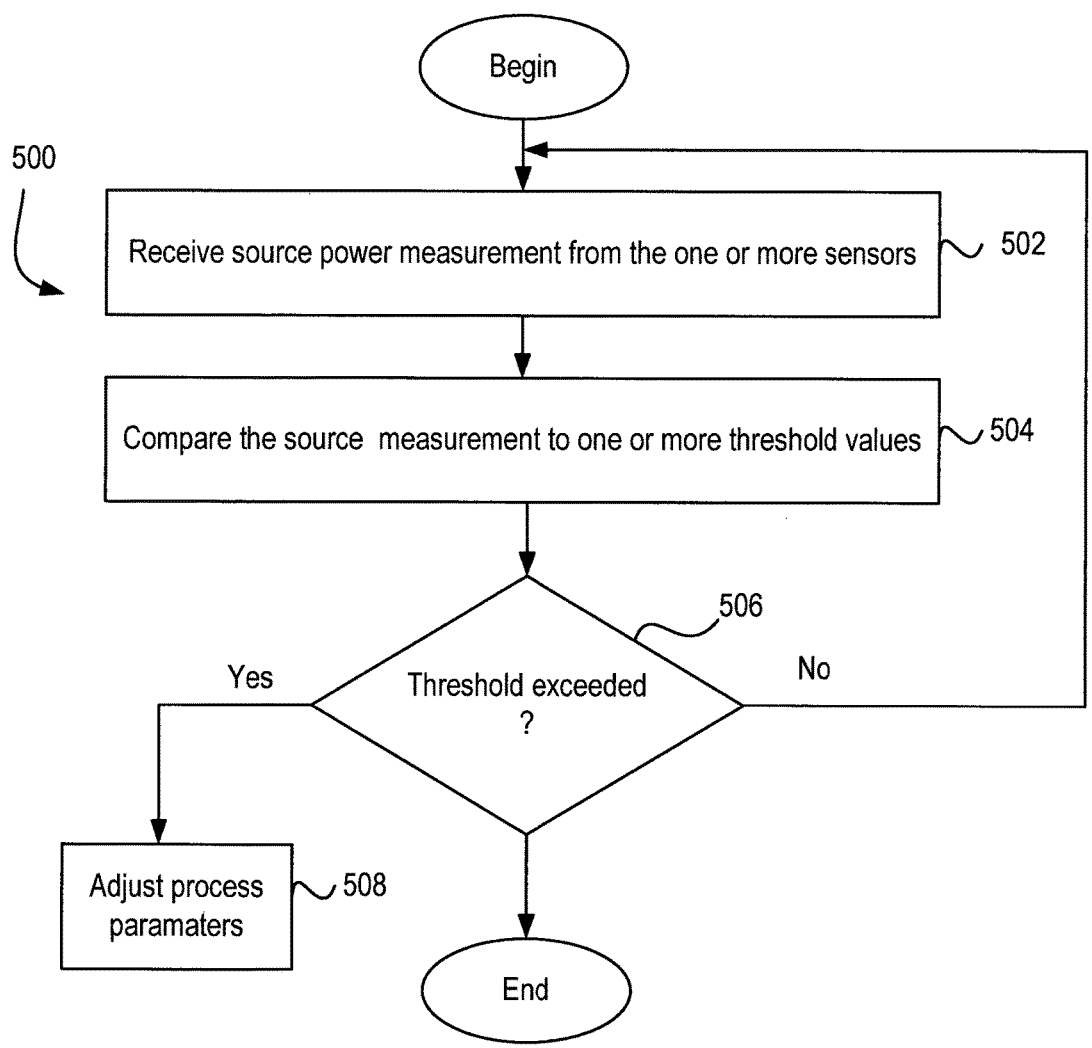
FIG. 5 is a flow diagram illustrating a method of monitoring a service life of a chamber component, according to one embodiment.

FIG. 5 is a flow diagram illustrating a method 400 for monitoring a service life of chamber components, according to one embodiment. As shown, the method 500 begins at block 502.

At block 502, the feedback collector 314 receives source measurements from one or more sensors 150. In one embodiment, the one or more sensors 150 are configured to measure a current of the RF source. In another embodiment, the one or more sensors are configured to measure a voltage of the RF source.

At block 504, the processor 304 compares the source power measurement to one or more threshold values. The one or more threshold values represent the source measurements that correspond to an amount of erosion of the cover ring 130 and the edge ring 132.

At block 506, the processor 304 determines whether the power source measurement exceeds the one or more threshold values. The one or more threshold values may correspond to one or more values that indicate a state of a processing chamber component. If the processor 304 determines that the source power measurements exceeds one of the threshold values, then at block 508 the processor 304 communicates with the controller 190 to issue a notice of the state of the cover ring. For example, the controller 190 may issue an alarm, such as a light or source, or issue an electronic notice, such as an email, text message, or other electronic signal to another electronic device, to notify a technician, operator, or other person/entity of the condition of the cover ring. Alternatively, the processor 304 may communicate with the controller 190 to stop processing, so that the cover ring or edge ring may be replaced. If the processor 304 determines that the source power measurement does not exceed one of the threshold values, then the method 500 reverts to block 502.

Figure 6:
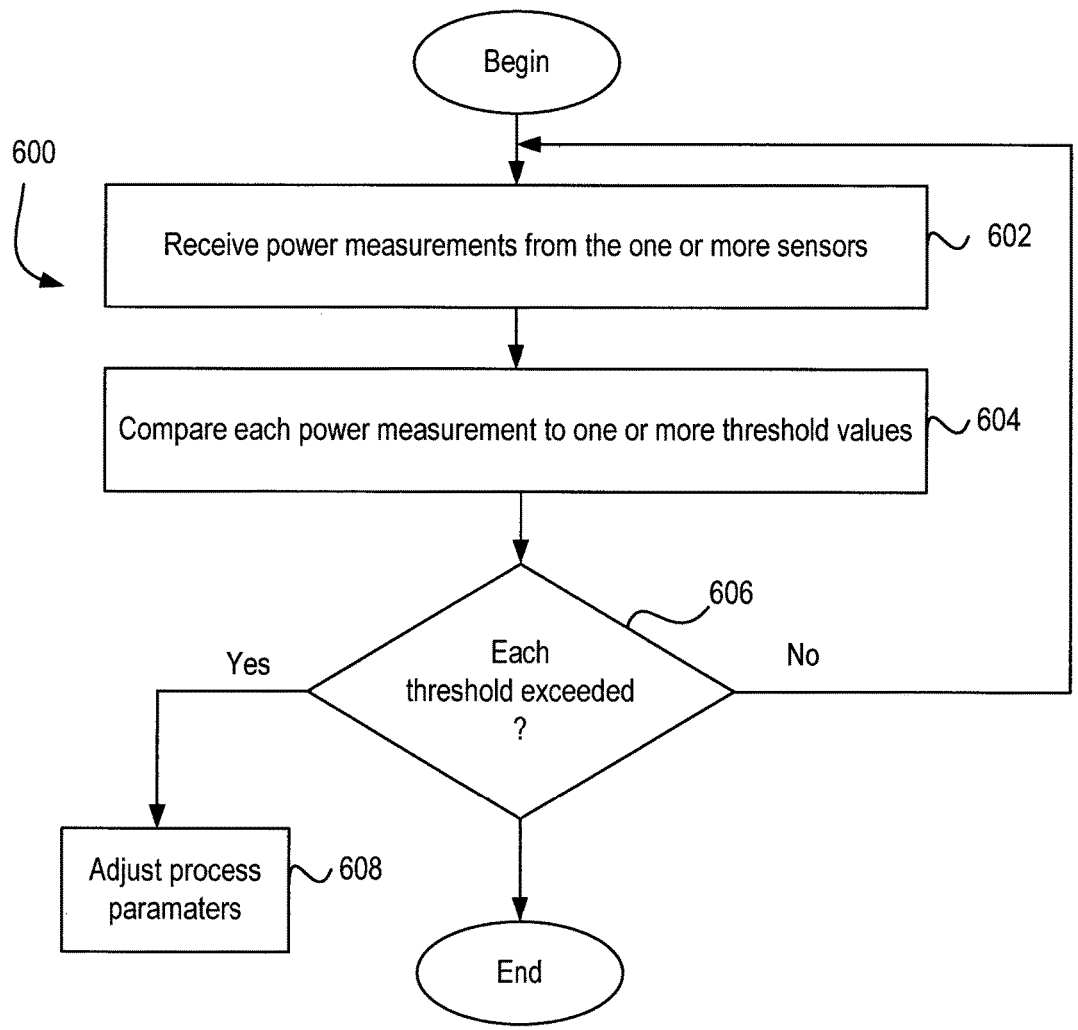
FIG. 6 is a flow diagram illustrating a method of monitoring a service life of a chamber component, according to one embodiment.

FIG. 6 is a flow diagram illustrating a method 600 for monitoring a service life of chamber components, according to one embodiment. As shown, the method 600 begins at block 602.

At block 602, the feedback collector 314 receives power measurements from one or more sensors 150. Each sensor 150 is configured to measure one of DC voltage, inner source current, and outer source current. In other embodiments, each sensor 150 may be configured to monitor other metrics associate with semiconductor processing.

At block 604, the processor 304 compares each power measurement received to a respective threshold value. The threshold values represent power measurements that correspond to an amount of erosion of the cover ring 130 and the edge ring 132. Generally, a downward trend in power measurements is indicative of the height H of the cover ring 130 eroding. For example, processor 304 may compare the measurements monitored by the sensor 150 assigned to DC voltage to a threshold value for DC voltage. The processor 304 may compare the measurements monitored by the sensor 150 assigned to inner source current to a threshold value for inner source current. The processor 304 may compare the measurements monitored by the sensor 150 assigned to outer source current to a threshold value for outer source current.

At block 606, the processor 304 determines whether each power measurement exceeds each respective threshold values. If the processor 304 determines that each power measurement exceeds each respective threshold value, then at block 608 the processor 304 communicates with the controller 190 to issue a notice of the state of the cover ring. For example, the controller 190 may issue an alarm, such as a light or source, or issue an electronic notice, such as an email, text message, or other electronic signal to another electronic device, to notify a technician, operator, or other person/entity of the condition of the cover ring. Alternatively, the processor 304 may communicate with the controller 190 to stop processing, so that the cover ring or edge ring may be replaced.

In some embodiments, as part of the threshold values, the processor 304 also determines how many instances there are of each power measurement exceeding the respective threshold value. For example, in order to trigger an exception, the processor 304 may have to determine that each power measurement exceeds each respective threshold value three times before proceeding the block 408. Such constraints to the exception provide a more accurate determination of cover ring erosion, as a single measurement exceeding a threshold value could be indicative of an anomaly.

If, however, the processor 304 determines that the DC bias measurement does not exceed one of the threshold values, then the method 600 reverts to block 602. By taking into account additional signals collected by additional sensors, method 600 is able to provide a more robust determination as to whether the service life of the chamber components.

Figure 7:
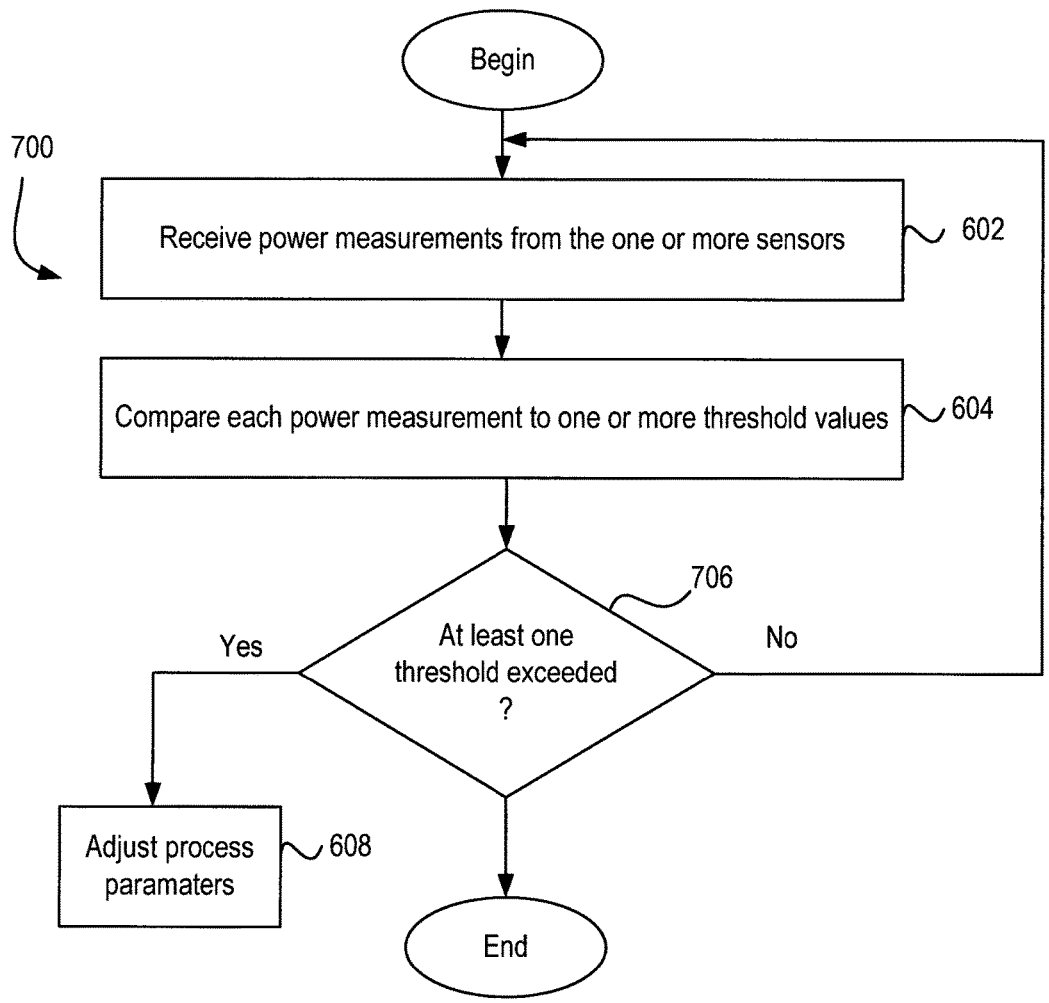
FIG. 7 is a flow diagram illustrating a method of monitoring a service life of a chamber component, according to one embodiment.

FIG. 7 is a flow diagram illustrating a method 700 for monitoring a service life of chamber components, according to one embodiment. Method 700 is substantially similar to method 600. However, rather than determining whether each power measurement exceeds its respective threshold value, at block 706, the processor 304 determines whether at least one power measurement exceeds its respective threshold value.

While the foregoing is directed to specific embodiments, other and further embodiments may be devised without departing from the basic scope thereof, and the scope thereof is determined by the claims that follow.

What is claimed is:

1. A method of monitoring a service life of a chamber component, comprising:
   receiving one or more power measurements of a semiconductor processing chamber from one or more sensors positioned about the semiconductor processing chamber, each sensor monitoring a respective power measurement, wherein the one or more power measurements comprise:
      a first power measurement directed to direct current (DC) voltage from a first sensor;
      a second power measurement directed to an inner source current from a second sensor; and
      a third power measurement directed to an outer source current from a third sensor;
   comparing the one or more power measurements to one or more threshold values corresponding to the service life of the chamber component, wherein each power measurements has a respective threshold value;
   determining whether the one or more power measurements exceed the one or more threshold values; and responsive to determining that the one or more power measurements exceed the threshold values, issuing a notice of a state of the chamber component.

2. The method of claim 1, wherein comparing the one or more power measurements to one or more threshold values corresponding to the service life of the chamber component, wherein each power measurement has a respective threshold value, comprises:
   comparing the first power measurement directed to DC voltage to a first threshold value;
   comparing the second power measurement directed to inner source current to a second threshold value; and
   comparing the third power measurement directed to outer source current to a third threshold value.

3. The method of claim 2, wherein determining whether the power measurement exceeds the one or more threshold values, comprises:
   determining whether the first power measurement exceeds the first threshold value a first number of times;
   determining whether the second power measurement exceeds the second threshold value a second number of times; and
   determining whether the third power measurement exceeds the third threshold value a third number of times.

4. The method of claim 2, wherein determining whether the power measurement exceeds the one or more threshold values, comprises:
   determining whether one of the first power measurement exceeds the first threshold value a first number of times, the second power measurement exceeds the second threshold value a second number of times, or the third power measurement exceeds the third threshold value a third number of times.

5. The method of claim 1, responsive to determining that the power measurement exceeds the threshold value, issuing a notice of a state of the chamber component, comprises:
   communicating with a controller coupled to the semiconductor processing chamber, the controller configured to adjust processing parameters of the semiconductor processing chamber.

6. The method of claim 1, responsive to determining that the power measurement exceeds the threshold value, issuing a notice of a state of the chamber component, comprises:
   stopping substrate processing.

7. A system, comprising:
   a processor;
   a semiconductor processing chamber having one or more sensors, each sensor in communication with the processor; and
   a memory storing program code, which, when executed on the processor, performs an operation for monitoring a service life of a chamber component, the operation comprising:
      receiving one or more power measurements of a semiconductor processing chamber from one or more sensors positioned about the semiconductor processing chamber, each sensor monitoring a respective power measurement, wherein the one or more power measurements comprise:
         a first power measurement directed to direct current (DC) voltage from a first sensor;
         a second power measurement directed to an inner source current from a second sensor; and
         a third power measurement directed to an outer source current from a third sensor;

comparing the one or more power measurements to one or more threshold values corresponding to the service life of the chamber component,
wherein each power measurements has a respective threshold value;
determining whether the one or more power measurements exceed the one or more threshold values; and
responsive to determining that the one or more power measurements exceed the threshold values, issuing a notice of a state of the chamber component.

8. The system of claim 7, wherein comparing the one or more power measurements to one or more threshold values corresponding to the service life of the chamber component, wherein each power measurement has a respective threshold value, comprises:
comparing the first power measurement directed to DC voltage to a first threshold value;
comparing the second power measurement directed to inner source current to a second threshold value; and
comparing the third power measurement directed to outer source current to a third threshold value.

9. The system of claim 8, wherein determining whether the power measurement exceeds the one or more threshold values, comprises:
determining whether the first power measurement exceeds the first threshold value a first number of times;
determining whether the second power measurement exceeds the second threshold value a second number of times; and
determining whether the third power measurement exceeds the third threshold value a third number of times.

10. The system of claim 8, wherein determining whether the power measurement exceeds the one or more threshold values, comprises:
determining whether one of the first power measurement exceeds the first threshold value a first number of times, the second power measurement exceeds the second threshold value a second number of times, or the third power measurement exceeds the third threshold value a third number of times.

11. The system of claim 7, wherein responsive to determining that the power measurement exceeds the threshold value, issuing a notice of a state of the chamber component, comprises:
communicating with a controller coupled to the semiconductor processing chamber, the controller configured to adjust processing parameters of the semiconductor processing chamber.

12. The system of claim 7, wherein responsive to determining that the power measurement exceeds the threshold value, issuing a notice of a state of the chamber component, comprises:
stopping substrate processing.

13. A computer readable storage medium having stored thereon instructions that, when executed by a processor, cause the processor to perform a method of monitoring a service life of a chamber component, the method comprising:
receiving one or more power measurements of a semiconductor processing chamber from one or more sensors positioned about the semiconductor processing chamber, each sensor monitoring a respective power measurement, wherein the one or more power measurements comprise:
a first power measurement directed to direct current (DC) voltage from a first sensor;
a second power measurement directed to an inner source current from a second sensor; and
a third power measurement directed to an outer source current from a third sensor;
comparing the one or more power measurements to one or more threshold values corresponding to the service life of the chamber component, wherein each power measurements has a respective threshold value;
determining whether the one or more power measurements exceed the one or more threshold values; and
responsive to determining that the one or more power measurements exceed the threshold values, issuing a notice of a state of the chamber component.

14. The computer readable storage medium claim 13, wherein comparing the one or more power measurements to one or more threshold values corresponding to the service life of the chamber component, wherein each power measurement has a respective threshold value, comprises:
comparing the first power measurement directed to DC voltage to a first threshold value;
comparing the second power measurement directed to inner source current to a second threshold value; and
comparing the third power measurement directed to outer source current to a third threshold value.

15. The computer readable storage medium claim 14, wherein determining whether the power measurement exceeds the one or more threshold values, comprises:
determining whether the first power measurement exceeds the first threshold value a first number of times;
determining whether the second power measurement exceeds the second threshold value a second number of times; and
determining whether the third power measurement exceeds the third threshold value a third number of times.

16. The computer readable storage medium claim 14, wherein determining whether the power measurement exceeds the one or more threshold values, comprises:
determining whether one of the first power measurement exceeds the first threshold value a first number of times, the second power measurement exceeds the second threshold value a second number of times, or the third power measurement exceeds the third threshold value a third number of times.

17. The computer readable storage medium of claim 13, wherein responsive to determining that the power measurement exceeds the threshold value, issuing a notice of a state of the chamber component, comprises:
communicating with a controller coupled to the semiconductor processing chamber, the controller configured to adjust processing parameters of the semiconductor processing chamber.

* * * * *